(12) United States Patent
Yang et al.

(10) Patent No.: US 12,538,659 B2
(45) Date of Patent: Jan. 27, 2026

(54) OLED DISPLAY SUBSTRATE AND DISPLAY DEVICE

(71) Applicants: Yunnan Invensight Optoelectronics Technology Co., Ltd., Yunnan (CN); BOE Technology Group Co., Ltd., Beijing (CN)

(72) Inventors: Zongshun Yang, Beijing (CN); Hongtao Yu, Beijing (CN); Kuanta Huang, Beijing (CN)

(73) Assignees: Yunnan Invensight Optoelectronics Technology Co., Ltd., Yunnan (CN); BOE Technology Group Co., Ltd., Beijing (CN)

( * ) Notice: Subject to any disclaimer, the term of this patent is extended or adjusted under 35 U.S.C. 154(b) by 610 days.

(21) Appl. No.: 17/914,242

(22) PCT Filed: Nov. 15, 2021

(86) PCT No.: PCT/CN2021/130564
§ 371 (c)(1),
(2) Date: Sep. 23, 2022

(87) PCT Pub. No.: WO2022/205931
PCT Pub. Date: Oct. 6, 2022

(65) Prior Publication Data
US 2024/0237411 A1   Jul. 11, 2024

(30) Foreign Application Priority Data
Mar. 30, 2021 (CN) .......................... 202110340902.X

(51) Int. Cl.
*H10K 59/122* (2023.01)
*H10K 59/35* (2023.01)

(52) U.S. Cl.
CPC ......... *H10K 59/122* (2023.02); *H10K 59/353* (2023.02)

(58) Field of Classification Search
None
See application file for complete search history.

(56) References Cited

U.S. PATENT DOCUMENTS

| 2005/0058840 | A1 | 3/2005 | Toyoda |
| 2010/0238096 | A1 | 9/2010 | Jeon et al. |

(Continued)

FOREIGN PATENT DOCUMENTS

| CN | 104851983 A | 8/2015 |
| CN | 110176480 A | 8/2019 |

(Continued)

OTHER PUBLICATIONS

CN 202110340902.X first office action.
PCT/CN2021/130564 international search report and written opinion.

*Primary Examiner* — Sue A Purvis
*Assistant Examiner* — Carnell Hunter, III
(74) *Attorney, Agent, or Firm* — IPro, PLLC

(57) ABSTRACT

This invention provides an OLED display substrate and a display device. The OLED display substrate includes a base substrate including a drive circuit layer; a first electrode layer including multiple independent first electrodes; and a pixel definition layer. A sub-pixel includes a first electrode and a light-emitting element. The sub-pixel includes a first-color sub-pixel, a second-color sub-pixel and a third-color sub-pixel. An orthographic projection of the first electrode of the first-color sub-pixel and the pixel definition layer onto the base substrate have a first overlap. An orthographic projection of the first electrode of the second-color sub-pixel and the pixel definition layer onto the base substrate have a second overlap. An orthographic projection (Continued)

of the first electrode of the third-color sub-pixel and the pixel definition layer onto the base substrate have a third overlap. The area of the first overlap is different from that of the second or third overlap.

11 Claims, 4 Drawing Sheets

(56) References Cited

U.S. PATENT DOCUMENTS

| | | |
|---|---|---|
| 2015/0270319 A1 | 9/2015 | Ishii et al. |
| 2016/0276615 A1 | 9/2016 | Kitabayashi |
| 2017/0236876 A1 | 8/2017 | Akagawa et al. |
| 2019/0096970 A1 | 3/2019 | Hou |
| 2019/0305057 A1 | 10/2019 | Cheng et al. |
| 2019/0305059 A1 | 10/2019 | Hou |
| 2019/0363146 A1 | 11/2019 | Takahashi et al. |
| 2021/0233966 A1* | 7/2021 | Xu .................... H10K 71/00 |
| 2022/0069027 A1 | 3/2022 | Wang et al. |

FOREIGN PATENT DOCUMENTS

| | | | |
|---|---|---|---|
| CN | 110635067 A | 12/2019 | |
| CN | 111293162 A | 6/2020 | |
| CN | 111799320 A | 10/2020 | |
| CN | 112106204 A * | 12/2020 | ......... H01L 27/3216 |
| CN | 113097417 A | 7/2021 | |
| IN | 111739924 A | 10/2020 | |
| JP | 2005166691 A | 6/2005 | |

\* cited by examiner

OLED DISPLAY SUBSTRATE AND DISPLAY DEVICE

This application is the U.S. national phase of PCT Application No. PCT/CN2021/130564 filed on Nov. 15, 2021, which claims a priority to Chinese Patent Application No. 202110340902.X filed in China on Mar. 30, 2021, the entire contents of which are hereby incorporated by reference.

TECHNICAL FIELD

The present invention relates to the technical field of displays, and more particularly, to an OLED display substrate and a display device.

BACKGROUND

OLED (Organic Light-Emitting Diode) display devices have been listed as the most promising next-generation display technology due to their advantages such as thinness, light weight, wide viewing angle, active light-emission, continuously adjustable emission color, low cost, fast response, low power consumption, low driving voltage, wide operating temperature range, simple production process, high light emission efficiency and flexible display.

SUMMARY

Embodiments of the present invention provide the following technical solutions.

In an aspect, an OLED display substrate is provided, including: a base substrate; a first electrode layer including a plurality of independent first electrodes on the base substrate; and a pixel definition layer on a side of the first electrode layer facing away from the base substrate. The base substrate has a display area, and the display area includes a plurality of sub-pixels; each of the sub-pixels includes a first electrode of the first electrodes and a light-emitting element. The pixel definition layer includes a plurality of opening regions, each of the sub-pixels includes a corresponding opening region, and the opening region exposes the first electrode of the sub-pixel. Each of the sub-pixels includes a first color sub-pixel, a second color sub-pixel, and a third color sub-pixel. An orthographic projection of a first electrode of the first color sub-pixel onto the base substrate and an orthographic projection of the pixel definition layer onto the base substrate have a first overlapping part. An orthographic projection of a first electrode of the second color sub-pixel onto the base substrate and the orthographic projection of the pixel definition layer onto the base substrate have a second overlapping part. An orthographic projection of a first electrode of the third color sub-pixel onto the base substrate and the orthographic projection of the pixel definition layer onto the base substrate have a third overlapping part. An area of the first overlapping part is different from an area of the second overlapping part or an area of the third overlapping part.

In some embodiments, the area of the first overlapping part is greater than the area of the second overlapping part, and the area of the second overlapping part is substantially equal to the area of the third overlapping part; or the area of the first overlapping part is greater than the area of the second overlapping part, and the area of the second overlapping part is greater than the area of the third overlapping part.

In some embodiments, an area of an opening region of the first color sub-pixel is smaller than an area of an opening region of the third color sub-pixel, and the area of the first overlapping part is greater than the area of the third overlapping part; an area of an opening region of the second color sub-pixel is less than the area of the opening region of the third color sub-pixel, and the area of the second overlapping part is greater than the area of the third overlapping part.

In some embodiments, a ratio of the area of the first overlapping part to the area of the third overlapping part is in a range of 1.1 to 2; and/or a ratio of the area of the second overlapping part to the area of the third overlapping part is in a range of 1.1 to 2.

In some embodiments, the OLED display substrate further includes: an organic light-emitting functional layer on a side of the pixel definition layer facing away from the base substrate. The organic light-emitting functional layer includes a plurality of first color light-emitting layers, a plurality of second color light-emitting layers, and a plurality of third color light-emitting layers. Orthographic projections of the first color light-emitting layers onto the base substrate cover an orthographic projection of the opening region of the first color sub-pixels onto the base substrate; orthographic projections of the second color light-emitting layers onto the base substrate cover an orthographic projection of the opening region of the second color sub-pixel onto the base substrate; orthographic projections of the third color light-emitting layers onto the base substrate cover an orthographic projection of the opening region of the third color sub-pixel onto the base substrate.

In some embodiments, the OLED display substrate includes a plurality of pixel repeating units, and each of the pixel repeating units includes the first color sub-pixel, the second color sub-pixel, and the third color sub-pixel.

In some embodiments, in one of the pixel repeating units, the opening regions of the first color sub-pixel, the second color sub-pixel and the third color sub-pixel are arranged along a first direction; the first overlapping part has a first width in a direction parallel to the base substrate and perpendicular to the first direction; the second overlapping part has a second width in a direction parallel to the base substrate and perpendicular to the first direction; the third overlapping part has a third width in a direction parallel to the base substrate and perpendicular to the first direction; the first width is not equal to the second width or the third width.

In some embodiments, the first width is greater than the second width, and the second width is substantially equal to the third width; or the first width is greater than the second width, and the second width is greater than the third width.

In some embodiments, a ratio of the first width to the third width is in a range of 1.1 to 2; and/or a ratio of the second width to the third width is in a range of 1.1 to 2.

In some embodiments, the first color sub-pixel, the second color sub-pixel and the third color sub-pixel are selected from a red sub-pixel, a blue sub-pixel and a green sub-pixel, and are different from each other in color.

In some embodiments, the first color sub-pixel is a red sub-pixel; the second color sub-pixel is a green sub-pixel; and the third color sub-pixel is a blue sub-pixel.

An embodiment of the present invention further provides a display device including the OLED display substrate as described above.

REFERENCE SIGNS

Figure 1:
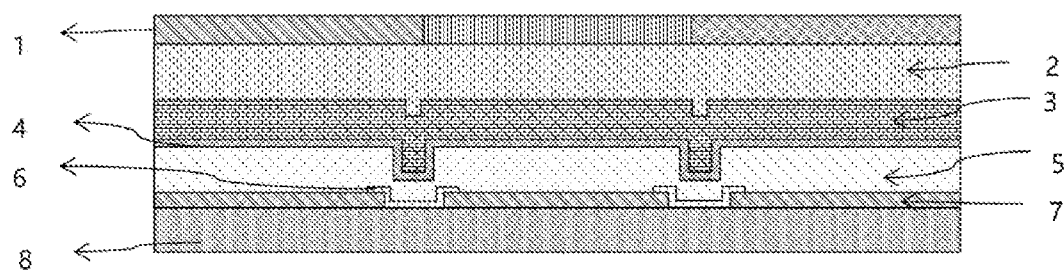
FIG. 1 shows a cross-sectional view of an OLED display substrate.

1 Color film layer
2 Planarization layer
3 Film encapsulation layer
4 Second electrode
5 Organic light-emitting functional layer
6 Pixel definition layer
7 First electrode
8 Base substrate
91 Red sub-pixel
92 Green sub-pixel
93 Blue sub-pixel

DETAILED DESCRIPTION

In order to make the technical problem to be solved, the technical solution, and the advantage of embodiments of the present invention more apparent, a detailed description will be given below with reference to the accompanying drawings and specific embodiments.

In the OLED display substrate, a first electrode layer includes a plurality of first electrodes that are independent from each other, and a groove is formed between adjacent first electrodes. After a second electrode is evaporated, the second electrode may sink at the position of the groove, and in severe cases, the second electrode penetrates the organic light-emitting functional layer and is short-circuited with the anode, resulting in the failure of the light-emitting unit. In order to prevent the second electrode from being short-circuited with the anode, a pixel definition layer 6 will cover the edge of the first electrode 7, as shown in FIG. 1, namely, there is an overlap between the edge of the first electrode 7 and the pixel definition layer 6, so that the second electrode 4 may be prevented from being short-circuited with the first electrode 7, where 1 represents a color film layer, 2 represents a planarization layer, 3 represents a film encapsulation layer, 5 represents an organic light-emitting functional layer, and 8 represents a base substrate.

When fabricating a pixel definition layer on an OLED display substrate, firstly, a pixel definition layer material is coated on the OLED display substrate on which the first electrode has been formed, then the pixel definition layer material is exposed using a mask plate of the pixel definition layer, and after development, the pattern of the pixel definition layer is formed. The mask plate of the pixel definition layer includes a transparent substrate and an opaque pattern on the transparent substrate, the opaque pattern is generally made of chromium (Cr), the opaque pattern corresponds to the pattern of the pixel definition layer, and after development, the material of the pixel definition layer corresponding to the opaque pattern is retained to form the pattern of the pixel definition layer.

Figure 2:
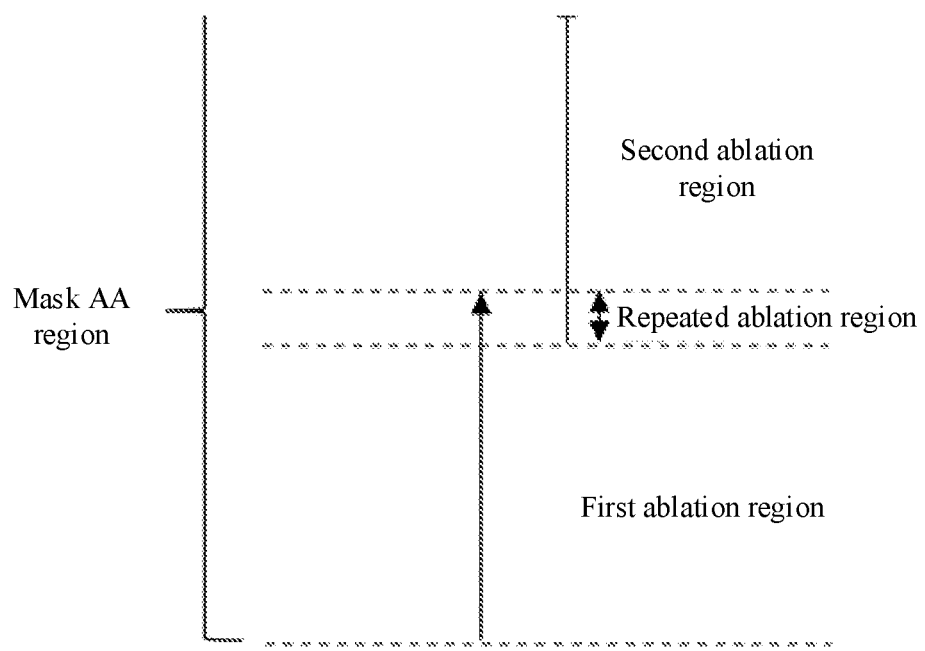
FIG. 2 shows a schematic diagram of a repeated ablation region on a mask plate of a pixel definition layer.
Figure 3:
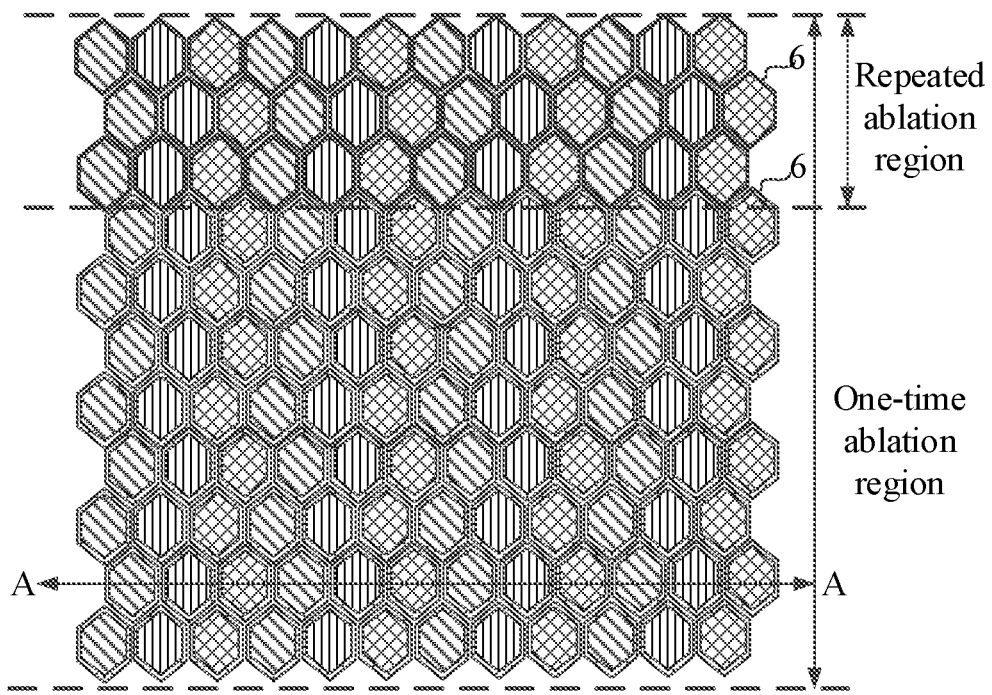
FIG. 3 shows a planar schematic diagram of an OLED display substrate.

In fabricating the mask plate of the pixel definition layer, a chromium (Cr) film is generally formed on a transparent substrate, and then the opaque pattern is formed by laser ablation of the chromium film. Since the area of the mask plate of the pixel definition layer is relatively large, ablation cannot be completed at one time and needs to be performed in stages. When ablation is performed for the second time, ablation is performed again by returning 6-8 um, so as to avoid omission. As shown in FIG. 2, there is a repeated ablation region between a first ablation region and the second ablation region, and the length of the repeated ablation region is 6-8 um. The size of the opaque pattern obtained after two ablations in the repeated ablation region is slightly different from the size of the opaque pattern of a one-time ablation region. After the pixel definition layer is fabricated by using the mask plate of the pixel definition layer, the size of the pixel definition layer corresponding to the repeated ablation region on the OLED display substrate is also different from the size of the pixel definition layer corresponding to the one-time ablation region. As shown in FIG. 3, the size of the pixel definition layer corresponding to the one-time ablation region is greater than the size of the pixel definition layer corresponding to the repeated ablation region. Since the repeated ablation region is regularly arranged on the mask plate of the pixel definition layer, the pattern of the pixel definition layer on the OLED display substrate also shows a slight regular difference. The OLED display substrate forms regular horizontal or vertical line (Mura) during display, which affects the display effect of the OLED display substrate.

Embodiments of the present invention provide an OLED display substrate and a display device, which may improve the display quality of the display device.

An embodiment of the present invention provides an OLED display substrate, as shown in FIG. 1, including:

a base substrate 8 including a drive circuit layer;

a first electrode layer including a plurality of first electrodes 7 on the base substrate 8, which are independent from each other; and where a pixel definition layer 6 is located on a side of the first electrode layer facing away from the base substrate;

the base substrate has a display area, and the display area includes a plurality of sub-pixels; the sub-pixel includes the first electrode and a light-emitting element;

the pixel definition layer includes a plurality of opening regions, the sub-pixel includes a corresponding opening region, and the opening region exposes the first electrode of the sub-pixel;

the sub-pixel includes a first color sub-pixel, a second color sub-pixel, and a third color sub-pixel;

an orthographic projection of the first electrode 7 of the first color sub-pixel onto the base substrate and an orthographic projection of the pixel definition layer 6 onto the base substrate have a first overlapping part;

an orthographic projection of the first electrode 7 of the second color sub-pixel onto the base substrate and the orthographic projection of the pixel definition layer 6 onto the base substrate have a second overlapping part;

an orthographic projection of the first electrode 7 of the third color sub-pixel onto the base substrate and the orthographic projection of the pixel definition layer 6 onto the base substrate have a third overlapping part;

the area of the first overlapping part is not equal to the area of the second overlapping part or the third overlapping part.

In the OLED display substrate of this embodiment, the overlap between the pixel definition layer and the first electrode is not a fixed area, and it is not regular, but has different areas for different sub-pixels, so that the overlap between the pixel definition layer and the first electrode is disordered and differentiated, which can visually weaken the periodic difference in the pattern of the pixel definition layer caused by the mask plate of the pixel definition layer, solve the regular horizontal or vertical stripes (Mura), and improve the display effect.

As shown in FIG. 1, the size of the overlap of the pixel definition layer 6 and the first electrode 7 depends on the size of the first electrode 7 and the size of the pixel definition layer 6. In general, in an OLED display substrate, in order to reduce the complexity of the process, all the first electrodes 7 of different color sub-pixels have the same size, and in this case, the size of the overlap of the pixel definition layer 6 and the first electrode 7 depends on the size of the pixel definition layer 6. Assuming that the difference in the size between the pixel definition layers of the one-time ablation region and the repeated ablation region is $\Delta PDL$, the slight regular difference in the patterns of the pixel definition layers may be measured by $\Delta PDL/PDL$ Size (the size of the pixel definition layer). The greater the PDL Size, the smaller the influence of the slight difference. Therefore, the influence of the regular horizontal or vertical stripes (Mura) can be alleviated by increasing the size of the pixel definition layer.

Figure 5:
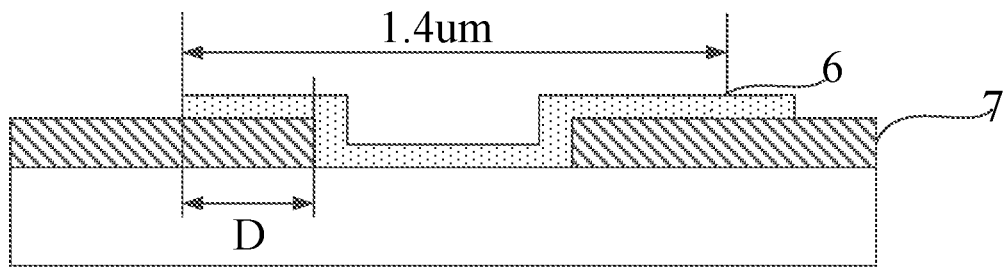
Figure 6:
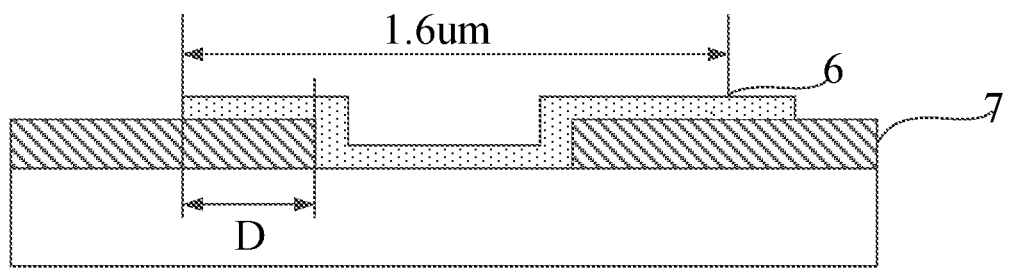
Figure 7:
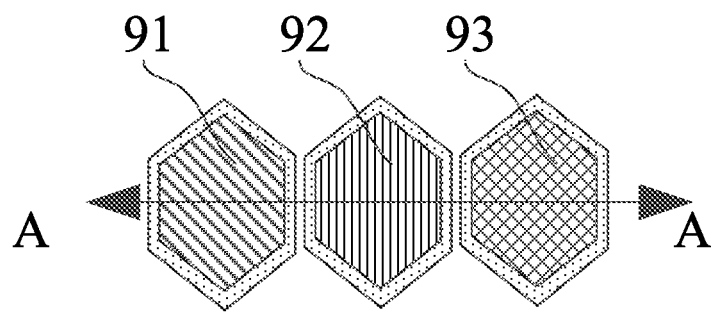
FIG. 7 shows a schematic diagram of pixel definition layers of different color sub-pixels having a same size.

As shown in FIGS. 5 to 7, the size of the pixel definition layer 6 may be measured by a width D of the pixel definition layer 6 in a first direction, a second direction is parallel to the base substrate and perpendicular to the extension direction (i.e. the first direction) of the pixel definition layer 6. In some embodiments, the value of D may be 1.2 um, 1.4 um and 1.6 um. When the size of the pixel definition layer 6 is 1.2 um, Mura is the most serious; when the size of the pixel definition layer 6 is 1.6 um, Mura is the smallest.

In this embodiment, while changing the design of the overlaps, the size of the pixel definition layer can be increased to further reduce the influence of regular horizontal or vertical strips (Mura) and improve the display effect.

In some embodiments, the area of the first overlapping part may be greater than the area of the second overlapping part, and the area of the second overlapping part is substantially equal to the area of the third overlapping part. In this way, the size of the pixel definition layer of the first color sub-pixel is different from the sizes of the pixel definition layers of the second color sub-pixel and the third color sub-pixel, which can visually weaken the periodic difference in the pattern of the pixel definition layer caused by the mask plate of the pixel definition layer, thereby to solve the regular horizontal or vertical stripes (Mura) and improve the display effect.

Alternatively, in some embodiments, the area of the first overlapping part is greater than the area of the second overlapping part, and the area of the second overlapping part is greater than the area of the third overlapping part. In this way, the size of the pixel definition layer of the first color sub-pixel is different from the sizes of both the pixel definition layers of the second color sub-pixel and the third color sub-pixel, which can visually weaken the periodic difference in the pattern of the pixel definition layer caused by the mask plate of the pixel definition layer, thereby to solve the regular horizontal or vertical strips (Mura) and improve the display effect.

In the case where all the first electrodes of the different-color sub-pixels have the same size, the area of the sub-pixel opening region may be adjusted by adjusting the sizes of the pixel definition layers of the different-color sub-pixels, so that the intensity of the light emitted by the different-color sub-pixels may be adjusted. In general, the larger the area of the opening region of the sub-pixel, the greater the intensity of the light emitted by the sub-pixel; and the smaller the area of the opening region of the sub-pixel, the smaller the intensity of the light emitted by the sub-pixel. In general, when the spacing between the first electrodes is constant, the larger the size of the pixel definition layer of the sub-pixel is, the larger the area of the overlapping part between the pixel definition layer of the sub-pixel and the first electrode is, and accordingly, the smaller the area of the opening region of the sub-pixel is; the smaller the size of the pixel definition layer of the sub-pixel is, the smaller the area of the overlapping part of the pixel definition layer of the sub-pixel with the first electrode is, and correspondingly, the larger the area of the opening region of the sub-pixel is.

In this embodiment, the areas of the overlaps (including the first overlapping part, the second overlapping part and the third overlapping part) of the different color sub-pixels can be adjusted, thereby adjusting the areas of the opening regions of the different color sub-pixels to achieve the target color coordinate.

In some embodiments, the area of the opening region of the first color sub-pixel is less than the area of the opening region of the third color sub-pixel, and the area of the first overlapping part is greater than the area of the third overlapping part; the area of the opening region of the second color sub-pixel is less than the area of the opening region of the third color sub-pixel, and the area of the second overlapping part is greater than the area of the third overlapping part, so that the intensity of the light emitted by the third color sub-pixel can be increased.

In some embodiments, a ratio of the area of the first overlapping part to the area of the third overlapping part may be in a range of 1.1 to 2; and/or a ratio of the area of the second overlapping part to the area of the third overlapping part may be in a range of 1.1 to 2.

Of course, in practical applications, the specific value of the ratio of the area of the first overlapping part to the area of the third overlapping part and the specific value of the ratio of the area of the second overlapping part to the area of the third overlapping part may be set according to the requirements of practical applications, which are not limited herein.

In some embodiments, the OLED display substrate further includes: an organic light-emitting functional layer on a side of the pixel definition layer facing away from the base substrate. The organic light-emitting functional layer includes a plurality of first color light-emitting layers, a plurality of second color light-emitting layers, and a plurality of third color light-emitting layers.

Orthographic projections of the first color light-emitting layers onto the base substrate cover orthographic projections of the opening regions of the first color sub-pixel onto the base substrate; orthographic projections of the second color light-emitting layers onto the base substrate cover orthographic projection of the opening regions of the second color sub-pixel onto the base substrate; orthographic projections of the third color light-emitting layers onto the base substrate cover orthographic projection of the opening regions of the third color sub-pixel onto the base substrate.

The organic light-emitting functional layer is used to form a light-emitting layer of a light-emitting element. Further, the organic light-emitting functional layer may further include film layers such as a hole injection layer, a hole transport layer, an electron transport layer, and an electron injection layer. The boundaries of the first color light-emitting layer, the second color light-emitting layer and the third color light-emitting layer may or may not overlap. For example, at least two of the first color light-emitting layer, the second color light-emitting layer, and the third color light-emitting layer have overlapping regions. As an example, the boundary of the first color light-emitting layer extends into the second color light-emitting layer.

Note that the light-emitting element may be provided as an electroluminescent diode, for example, at least one of an organic light-emitting diode (OLED) or a quantum dot light-emitting diode (QLED). The light-emitting element may include a first electrode (for example, an anode of the light-emitting element), an organic light-emitting functional layer, and a second electrode (for example, a cathode of the light-emitting element), which are stacked. Of course, the present disclosure includes but not limited to such design. In practical applications, the design may be made according to the requirements of practical applications, and is not limited herein.

In some embodiments, the OLED display substrate includes a plurality of pixel repeating units; each of the pixel repeating units includes the first color sub-pixel, the second color sub-pixel, and the third color sub-pixel. This enables the display panel to mix light using the first color sub-pixel, the second color sub-pixel and the third color sub-pixel, so as to achieve a color display. In some examples, the first color sub-pixel, the second color sub-pixel and the third color sub-pixel may be selected from a red sub-pixel, a green sub-pixel and a blue sub-pixel, where the first color sub-pixel, the second color sub-pixel and the third color sub-pixel are different in color. For example, the second color is red, the first color is green, and the third color is blue. Of course, the embodiments of the present disclosure includes, but is not limited to, such a design. The above-mentioned first color, second color and third color may also be other colors.

In some embodiments, in the same pixel repeating unit, the opening regions of the first color sub-pixel, the second color sub-pixel and the third color sub-pixel are arranged along a first direction;
the first overlapping part has a first width in a direction parallel to the base substrate and perpendicular to the first direction;
the second overlapping part has a second width in a direction parallel to the base substrate and perpendicular to the first direction;
the third overlapping part has a third width in a direction parallel to the base substrate and perpendicular to the first direction;
the first width is not equal to the second width or the third width.

In the OLED display substrate, the area of the first overlapping part depends on the size of the first width, and the larger the first width, the larger the area of the first overlapping part; the smaller the first width, the smaller the area of the first overlapping part. The area of the second overlapping part depends on the size of the second width, and the larger the second width is, the larger the area of the second overlapping part is; the smaller the second width is, the smaller the area of the second overlapping part is. The area of the third overlapping part depends on the size of the third width, and the larger the third width, the larger the area of the third overlapping part; the smaller the third width, the smaller the area of the third overlapping part.

Figure 4:
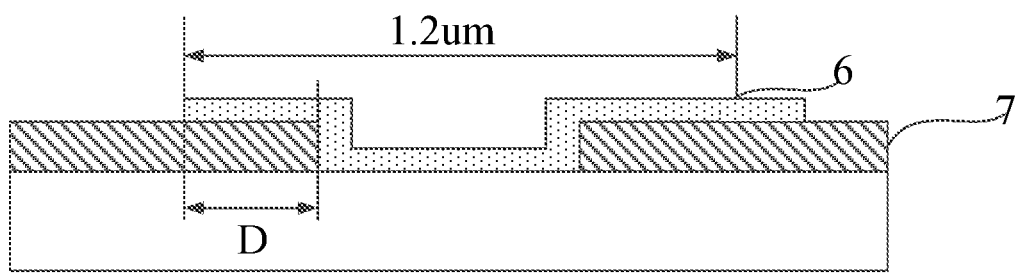
FIG. 4 to FIG. 6 are schematic diagrams illustrating the adjusting of the size of a pixel definition layer.

As shown in FIG. 7, a pixel repeating unit of an existing OLED display substrate includes a red sub-pixel 91, a green sub-pixel 92 and a blue sub-pixel 93. A schematic cross-sectional view of the sub-pixel taken along the AA direction is as shown in FIG. 4; in each of the red sub-pixel 91, the green sub-pixel 92 and the blue sub-pixel 93, the width of the overlapping part between the pixel definition layer 6 and the first electrode 7 in the second direction is D. In the red sub-pixel 91, the green sub-pixel 92 and the blue sub-pixel 93, the overlapping parts between the pixel definition layers 6 and the first electrodes 7 have the same area, so that regular horizontal or vertical stripes (Mura) are formed.

In an embodiment, the above-mentioned width of at least one of the first color sub-pixel, the second color sub-pixel, or the third color sub-pixel is decreased, to alleviate the influence of the regular horizontal or vertical stripes (Mura).

In some embodiments, the first width is greater than the second width, and the second width is substantially equal to the third width. In this way, the size of the pixel definition layer of the first color sub-pixel is different from the sizes of the pixel definition layers of the second color sub-pixel and the third color sub-pixel, which can visually weaken the periodic difference in the pattern of the pixel definition layer caused by the mask plate of the pixel definition layer, so as to solve the regular horizontal or vertical stripes (Mura) and improve the display effect.

Alternatively, in some embodiments, the first width is greater than the second width, and the second width is greater than the third width. In this way, the size of the pixel definition layer of the first color sub-pixel is different from the sizes of both the pixel definition layers of the second color sub-pixel and the third color sub-pixel, which can visually weaken the periodic difference in the pattern of the pixel definition layer caused by the mask plate of the pixel definition layer, so as to solve the regular horizontal or vertical strips (Mura) and improve the display effect.

In some embodiments, a ratio of the first width to the third width is in a range of 1.1 to 2; and/or a ratio of the second width to the third width is in a range of 1.1 to 2.

Of course, in practical applications, the specific value of the ratio of the first width to the third width and the specific value of the ratio of the second width to the third width may be set according to the requirements of practical applications, and are not limited herein.

Figure 8:
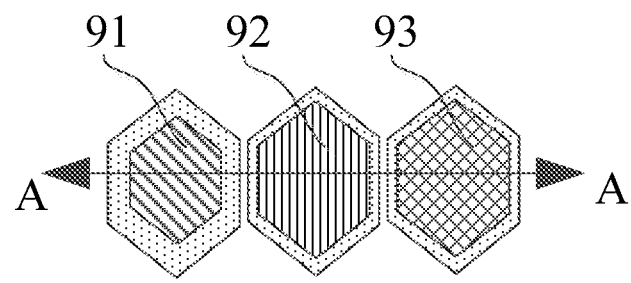
FIGS. 8 to 13 are schematic diagrams illustrating pixel definition layers of different color sub-pixels having sizes that are not completely same according to embodiments of the present invention.
Figure 9:
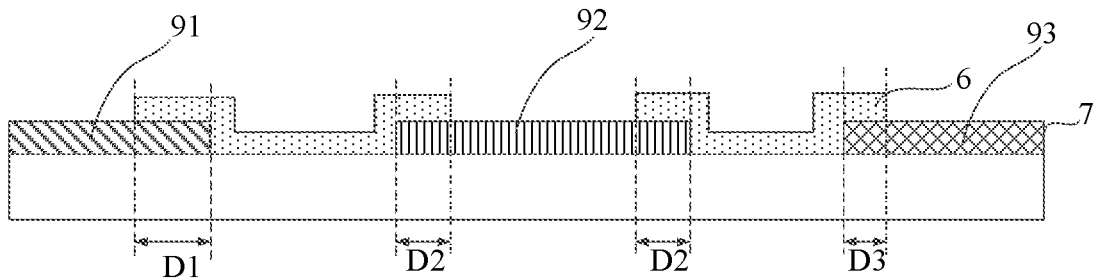

In a particular example, as shown in FIG. 8, a pixel repeating unit of the OLED display substrate includes a red sub-pixel 91, a green sub-pixel 92 and a blue sub-pixel 93. A schematic cross-sectional view of the red sub-pixel 91, the green sub-pixel 92 and the blue sub-pixel 93 taken along the AA direction is as shown in FIG. 9. In the red sub-pixel 91, D1 represents a width of the first overlapping part of orthographic projections of the pixel definition layer 6 and the first electrode 7 onto the base substrate in the second direction parallel to the base substrate and perpendicular to the first direction. In the green sub-pixel 92, D2 represents a width of the second overlapping part of orthographic projections of the pixel definition layer 6 and the first electrode 7 onto the base substrate in the second direction parallel to the base substrate and perpendicular to the first direction. In the blue sub-pixel 93, D3 represents a width of the third overlapping part of orthographic projections of the pixel definition layer 6 and the first electrode 7 onto the base substrate in the second direction parallel to the base substrate and perpendicular to the first direction.

D1 is greater than D2, and D2 is greater than D3. That is, the area of the first overlapping part is greater than the area of the second overlapping part, and the area of the second overlapping part is greater than the area of the third overlapping part, so that in sub-pixels with different colors, overlapping parts of the pixel definition layers and the first electrodes are disordered and differentiated, which can visually weaken the periodic difference in a pattern of the pixel definition layer caused by the mask plate of the pixel definition layer, so as to reduce the regular horizontal or vertical stripes (Mura) and improve the display effect.

Figure 10:
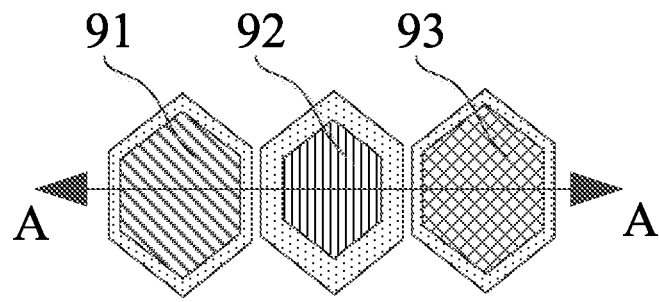
Figure 11:
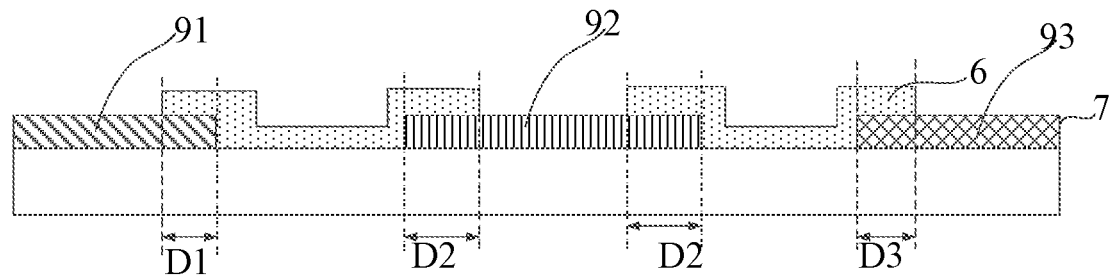

In another particular example, as shown in FIG. 10, the pixel repeating unit of the OLED display substrate includes a red sub-pixel 91, a green sub-pixel 92 and a blue sub-pixel 93. A schematic cross-sectional view of the red sub-pixel 91, the green sub-pixel 92 and the blue sub-pixel 93 taken along the AA direction is as shown in FIG. 11. In the red sub-pixel 91, D1 represents a width of the first overlapping part of the orthographic projections of the pixel definition layer 6 and the first electrode 7 onto the base substrate in the second direction parallel to the base substrate and perpendicular to the first direction. In the green sub-pixel 92, D2 represents a width of the second overlapping part of the orthographic projections of the pixel definition layer 6 and the first electrode 7 onto the base substrate in the second direction parallel to the base substrate and perpendicular to the first direction. In the blue sub-pixel 93, D3 represents a width of the third overlapping part of the orthographic projections of the pixel definition layer 6 and the first electrode 7 onto the base substrate in the second direction parallel to the base substrate and perpendicular to the first direction.

D2 is greater than D3, and D3 is greater than D1. That is, the area of the second overlapping part is greater than the area of the third overlapping part, and the area of the third overlapping part is greater than the area of the first overlapping part, so that in sub-pixels with different colors, the overlapping parts of the pixel definition layers and the first electrodes are disordered and differentiated, and the periodic difference in the pattern of the pixel definition layer caused by the mask plate of the pixel definition layer can be visually weakened, so as to solve the regular horizontal or vertical stripes (Mura) and improve the display effect.

Figure 12:
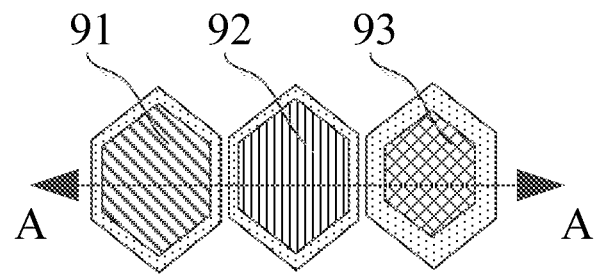
Figure 13:
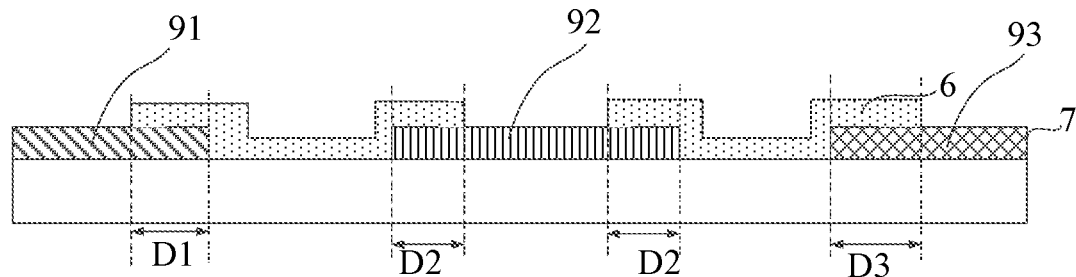

In another particular example, as shown in FIG. 12, a pixel repeating unit of the OLED display substrate includes a red sub-pixel 91, a green sub-pixel 92 and a blue sub-pixel 93. A schematic cross-sectional view of the red sub-pixel 91, the green sub-pixel 92 and the blue sub-pixel 93 taken along the AA direction is as shown in FIG. 13. In the red sub-pixel 91, D1 represents a width of the first overlapping part of the orthographic projections of the pixel definition layer 6 and the first electrode 7 onto the base substrate in the second direction parallel to the base substrate and perpendicular to the first direction. In the green sub-pixel 92, D2 represents a width of the second overlapping part of the orthographic projections of the pixel definition layer 6 and the first electrode 7 onto the base substrate in the second direction parallel to the base substrate and perpendicular to the first direction. In the blue sub-pixel 93, D3 represents a width of the third overlapping part of the orthographic projection of the pixel definition layer 6 and the first electrode 7 onto the base substrate in the second direction parallel to the base substrate and perpendicular to the first direction.

D3 is greater than D1, and D1 is greater than D2. That is, the area of the third overlapping part is greater than the area of the first overlapping part, and the area of the first overlapping part is greater than the area of the second overlapping part, so that in sub-pixels with different colors, the overlapping parts of the pixel definition layers and the first electrodes are disordered and differentiated, and the periodic difference in the pattern of the pixel definition layers caused by the mask plate of the pixel definition layer can be visually weakened, so as to solve the regular horizontal or vertical stripes (Mura) and improve the display effect.

In some embodiments, the first color sub-pixel is a red sub-pixel; the second color sub-pixel is a green sub-pixel; the third color sub-pixel is a blue sub-pixel.

As the luminous efficiency of the green light-emitting element and the luminous efficiency of the red light-emitting element are generally higher than the luminous efficiency of the blue light-emitting element, the area of the opening region of the green sub-pixel may be made smaller than the area of the opening region of the blue sub-pixel, and the area of the opening region of the red sub-pixel may be made smaller than the area of the opening region of the blue sub-pixel, so that the emission of blue light may be increased. Accordingly, the area of the first overlapping part in the red sub-pixel is larger than the area of the third overlapping part in the blue sub-pixel, and the area of the second overlapping part in the green sub-pixel is larger than the area of the third overlapping part in the blue sub-pixel.

An embodiment of the present invention further provides a display device including the OLED display substrate as described above. The principle for solving the problem of the display device is similar to that of the aforementioned OLED display substrate, and therefore the implementation of the display device may be referred to the implementation of the OLED display substrate, and the description thereof will not be repeated herein.

The display device includes, but not limited to: a radio frequency unit, a network module, an audio output unit, an input unit, a sensor, a display unit, a user input unit, an interface unit, a memory, a processor, a power supply, etc. It will be appreciated by those skilled in the art that the structure of the display device described above is not intended to limit a display device, and the display device may include more or fewer of the components described above, or some combinations of the components, or different arrangements of the components. In embodiments of the present invention, the display device includes, but not limited to, a display, a cell phone, a tablet, a television, a wearable electronic device, a navigation display device, etc.

The display device may be any product or component with a display function, such as a television, a display, a digital photo frame, a mobile phone, a tablet computer. The display device further includes a flexible circuit board, a printed circuit board and a back plate.

It should be noted that the various embodiments described herein are described in a progressive manner with reference to the same or similar parts throughout the various embodiments, with each embodiment focusing on the difference from the other embodiments. In particular, the embodiments are described more simply because they are substantially similar to the product embodiments, with reference to the partial description of the product embodiments.

Unless defined otherwise, technical or scientific terms used in this disclosure shall have the ordinary meaning as understood by one of ordinary skill in the art to which this disclosure belongs. The terms "first", "second", and the like as used herein do not denote any order, quantity, or importance, but rather are used to distinguish one element from another. The terms "include" or "include", and the like means that the presence of an element or item preceding the word covers the presence of the element or item listed after the word and equivalents thereof, but does not exclude other elements or items. The terms "connecting" or "connected" and the like are not limited to physical or mechanical connections, but may include electrical connections, whether direct or indirect. The terms "upper", "lower", "left", "right" and the like are used only to indicate relative positional relationships that may change accordingly when the absolute position of the object being described changes.

It will be understood that when an element such as a layer, film, region or substrate is referred to as being "on" or "under" another element, it can be "directly on" or "directly under" the other element, or intervening elements may be present.

In the description of the above implementations, particular features, structures, materials, or characteristics may be combined in any suitable manner in any one or more embodiments or examples.

The above implementations are only specific embodiments of the present disclosure, but the protection scope of the present disclosure is not limited herein. A person of ordinary skill in the art can think of changes or equivalents within the technical scope of the present disclosure, which shall fall within the protection scope of the present disclosure. Therefore, the protection scope of the present disclosure is as set forth in the claims below.

What is claimed is:

1. An OLED display substrate, comprising:
   a base substrate comprising a drive circuit layer;
   a first electrode layer comprising a plurality of first electrodes on the base substrate that are independent from each other; and
   a pixel definition layer on a side of the first electrode layer facing away from the base substrate;
   wherein the base substrate has a display area, and the display area comprises a plurality of sub-pixels; each of the sub-pixels comprises a first electrode of the first electrodes and a light-emitting element;
   the pixel definition layer comprises a plurality of opening regions, each of the sub-pixels comprises a corresponding opening region, and the opening region exposes the first electrode of the sub-pixel;
   each of the sub-pixels comprises a first color sub-pixel, a second color sub-pixel, and a third color sub-pixel;
   wherein an orthographic projection of a first electrode of the first color sub-pixel onto the base substrate and an orthographic projection of the pixel definition layer onto the base substrate have a first overlapping part;
   an orthographic projection of a first electrode of the second color sub-pixel onto the base substrate and the orthographic projection of the pixel definition layer onto the base substrate have a second overlapping part;
   an orthographic projection of a first electrode of the third color sub-pixel onto the base substrate and the orthographic projection of the pixel definition layer onto the base substrate have a third overlapping part;
   an area of the first overlapping part is different from an area of the second overlapping part or an area of the third overlapping part; and
   wherein the area of the first overlapping part is greater than the area of the second overlapping part, and the area of the second overlapping part is substantially equal to the area of the third overlapping part.

2. The OLED display substrate according to claim 1, wherein an area of an opening region of the first color sub-pixel is smaller than an area of an opening region of the third color sub-pixel, and the area of the first overlapping part is greater than the area of the third overlapping part.

3. The OLED display substrate according to claim 1, wherein a ratio of the area of the first overlapping part to the area of the third overlapping part is in a range of 1.1 to 2.

4. The OLED display substrate according to claim 1, wherein the OLED display substrate further comprises:
   an organic light-emitting functional layer on a side of the pixel definition layer facing away from the base substrate;
   the organic light-emitting functional layer comprises a plurality of first color light-emitting layers, a plurality of second color light-emitting layers, and a plurality of third color light-emitting layers;
   wherein orthographic projections of the first color light-emitting layers onto the base substrate cover an orthographic projection of the opening region of the first color sub-pixels onto the base substrate;
   orthographic projections of the second color light-emitting layers onto the base substrate cover an orthographic projection of the opening region of the second color sub-pixel onto the base substrate; and
   orthographic projections of the third color light-emitting layers onto the base substrate cover an orthographic projection of the opening region of the third color sub-pixel onto the base substrate.

5. The OLED display substrate according to claim 1, wherein the OLED display substrate comprises a plurality of pixel repeating units, and each of the pixel repeating units comprises the first color sub-pixel, the second color sub-pixel, and the third color sub-pixel.

6. The OLED display substrate according to claim 5, wherein in one of the pixel repeating units, the opening regions of the first color sub-pixel, the second color sub-pixel and the third color sub-pixel are arranged along a first direction;
   the first overlapping part has a first width in a direction parallel to the base substrate and perpendicular to the first direction;
   the second overlapping part has a second width in a direction parallel to the base substrate and perpendicular to the first direction;
   the third overlapping part has a third width in a direction parallel to the base substrate and perpendicular to the first direction; and
   the first width is not equal to the second width or the third width.

7. The OLED display substrate according to claim 6, wherein
   the first width is greater than the second width, and the second width is substantially equal to the third width.

8. The OLED display substrate according to claim 7, wherein
   a ratio of the first width to the third width is in a range of 1.1 to 2.

9. The OLED display substrate according to claim 1, wherein the first color sub-pixel, the second color sub-pixel and the third color sub-pixel are selected from a red sub-pixel, a blue sub-pixel and a green sub-pixel, and are different from each other in color.

10. The OLED display substrate according to claim 9, wherein
    the first color sub-pixel is a red sub-pixel;
    the second color sub-pixel is a green sub-pixel; and
    the third color sub-pixel is a blue sub-pixel.

11. A display device, comprising the OLED display substrate according to claim 1.

* * * * *